(12) United States Patent
Riordon et al.

(10) Patent No.: US 8,768,040 B2
(45) Date of Patent: Jul. 1, 2014

(54) SUBSTRATE IDENTIFICATION AND TRACKING THROUGH SURFACE REFLECTANCE

(75) Inventors: Benjamin Riordon, Newburyport, MA (US); Russell J. Low, Dellwood, MN (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 216 days.

(21) Appl. No.: 13/006,545

(22) Filed: Jan. 14, 2011

(65) Prior Publication Data

US 2012/0183199 A1 Jul. 19, 2012

(51) Int. Cl.
*G06K 9/00* (2006.01)

(52) U.S. Cl.
USPC ........... 382/151; 382/140; 382/143; 382/149; 382/209; 382/181

(58) Field of Classification Search
USPC .................. 382/151, 140, 143, 149, 209, 181
See application file for complete search history.

(56) References Cited

U.S. PATENT DOCUMENTS

| | | | | |
|---|---|---|---|---|
| 4,845,374 A | * | 7/1989 | White et al. | 250/559.4 |
| 4,943,732 A | * | 7/1990 | Economou | 250/559.46 |
| 5,334,844 A | * | 8/1994 | Pollard et al. | 250/330 |
| 5,367,174 A | * | 11/1994 | Bazile et al. | 250/559.45 |
| 6,359,212 B1 | * | 3/2002 | Hall et al. | 356/239.2 |
| 6,433,867 B1 | * | 8/2002 | Esquivel | 356/237.2 |
| 7,068,363 B2 | * | 6/2006 | Bevis et al. | 356/237.5 |
| 7,155,052 B2 | * | 12/2006 | Geshel et al. | 382/144 |
| 7,190,458 B2 | | 3/2007 | Borden et al. | |
| 7,218,386 B2 | * | 5/2007 | Alcock et al. | 356/71 |
| 7,495,758 B2 | * | 2/2009 | Walton | 356/237.1 |
| 7,583,821 B2 | * | 9/2009 | Xie et al. | 382/108 |
| 8,084,293 B2 | | 12/2011 | Riordon et al. | |
| 2008/0087321 A1 | * | 4/2008 | Schwartzman | 136/246 |
| 2009/0050195 A1 | * | 2/2009 | Ogasahara | 136/251 |
| 2009/0237669 A1 | * | 9/2009 | Hariyama et al. | 356/445 |
| 2010/0026997 A1 | * | 2/2010 | Hayashi et al. | 356/237.5 |
| 2010/0154870 A1 | | 6/2010 | Bateman et al. | |
| 2010/0182421 A1 | * | 7/2010 | Chidambaram et al. | 348/126 |
| 2010/0188486 A1 | | 7/2010 | Amanullah et al. | |
| 2010/0218821 A1 | * | 9/2010 | Kim et al. | 136/256 |
| 2010/0229917 A1 | * | 9/2010 | Choi et al. | 136/244 |
| 2010/0271633 A1 | * | 10/2010 | Gomi | 356/448 |
| 2010/0294357 A1 | * | 11/2010 | Hyun | 136/256 |
| 2011/0083717 A1 | * | 4/2011 | Nishi et al. | 136/244 |
| 2012/0160306 A1 | * | 6/2012 | Hirai et al. | 136/252 |

FOREIGN PATENT DOCUMENTS

| | | |
|---|---|---|
| WO | 2005080950 A1 | 9/2005 |
| WO | 2010064720 A1 | 6/2010 |

\* cited by examiner

*Primary Examiner* — Jayesh A Patel (57) ABSTRACT

A method of identifying individual silicon substrates, and particularly solar cells, is disclosed. Every solar cell possesses a unique set of optical properties. The method identifies these properties and stores them in a database, where they can be associated to a particular solar cell. Unlike conventional tracking techniques, the present method requires no dedicated space on the surface of the silicon substrate. This method allows substrates to be tracked through the manufacturing process, as well as throughout the life of the substrate.

20 Claims, 10 Drawing Sheets

| | CHARACTERISTIC PATTERN FOR THIS SUBSTRATE: | |
|---|---|---|
| | x | y |
| 1 | | |
| 2 | | |
| 3 | | |
| 4 | | |
| 5 | | |
| 6 | | |
| 7 | | |
| 8 | | |
| 9 | | |

SUBSTRATE IDENTIFICATION AND TRACKING THROUGH SURFACE REFLECTANCE

FIELD

This invention relates to identification of silicon substrates and, more particularly, to a method of identifying solar cells during the manufacturing process.

BACKGROUND

Ion implantation is a standard technique for introducing conductivity-altering impurities into substrates. A desired impurity material is ionized in an ion source, the ions are accelerated to form an ion beam of prescribed energy, and the ion beam is directed at the surface of the substrate. The energetic ions in the beam penetrate into the bulk of the substrate material and are embedded into the crystalline lattice of the substrate material to form a region of desired conductivity.

Solar cells provide pollution-free, equal-access energy using a free natural resource. Due to environmental concerns and rising energy costs, solar cells, which may be composed of silicon substrates, are becoming more globally important. Any reduced cost to the manufacture or production of high-performance solar cells or any efficiency improvement to high-performance solar cells would have a positive impact on the implementation of solar cells worldwide. This will enable the wider availability of this clean energy technology.

Figure 1:
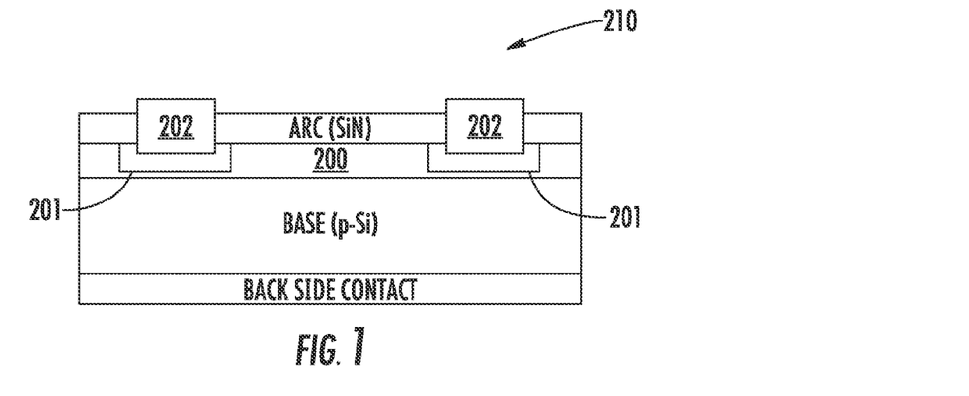
FIG. 1 is a cross-sectional view of a selective emitter solar cell.
Figure 2:
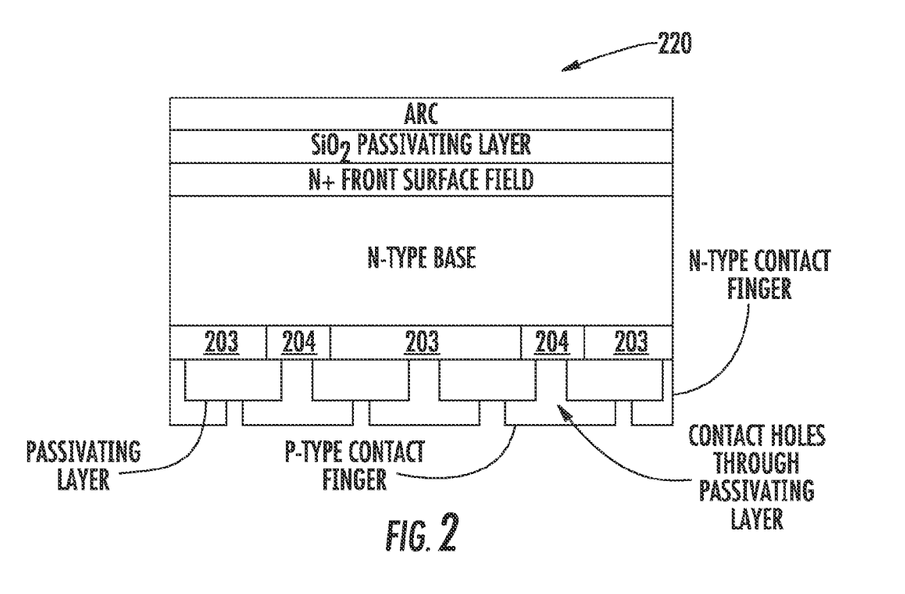
FIG. 2 is a cross-sectional view of an interdigitated back contact solar cell.

Doping may improve efficiency of solar cells. FIG. 1 is a cross-sectional view of a selective emitter solar cell 210. It may increase efficiency (e.g. the percentage of power converted and collected when a solar cell is connected to an electrical circuit) of a solar cell 210 to dope the emitter 200 and provide additional dopant to the regions 201 under the contacts 202. More heavily doping the regions 201 improves conductivity and having less doping between the contacts 202 improves charge collection. The contacts 202 may only be spaced approximately 2-3 mm apart. The regions 201 may only be approximately 100-300 μm across. FIG. 2 is a cross-sectional view of an interdigitated back contact (IBC) solar cell 220. In the IBC solar cell, the junction is on the back of the solar cell 220. The doping pattern is alternating p-type and n-type dopant regions in this particular embodiment. The p+ emitter 203 and the n+ back surface field 204 may be doped. This doping may enable the junction in the IBC solar cell to function or have increased efficiency.

In the past, solar cells have been doped using a dopant-containing glass or a paste that is heated to diffuse dopants into the solar cell. This does not allow precise doping of the various regions of the solar cell and, if voids, air bubbles, or contaminants are present, non-uniform doping may occur. Solar cells could benefit from ion implantation because ion implantation allows precise doping of the solar cell. Ion implantation of solar cells, however, may require a certain pattern of dopants or that only certain regions of the solar cell substrate are implanted with ions. Previously, implantation of only certain regions of a substrate has been accomplished using photoresist and ion implantation. Use of photoresist, however, would add an extra cost to solar cell production because extra process steps are involved. Other hard masks on the solar cell surface likewise are expensive and require extra steps.

The production of a solar cell requires many individual, sequential processing steps. Some of these steps may include:

Cutting/wire sawing of the silicon
Packaging/removal
Sorting
Cleaning/etching
Implant and anneal or diffusion
Application of an anti-reflective coating (ARC)
Application of metal contacts and firing
Inspection/cell testing
Cell sorting This list is not intended to be comprehensive and only serves to show the number of different steps which a solar cell must do through during production.

A primary goal of solar cell production is to produce the most efficient cells at the lowest production cost. Each of the above mentioned steps adds cost to the solar cell production process, as well as creating variability in the quality of the completed product.

To better understand the process, cell performance parameters, such as short circuit current density ($J_{sc}$), open circuit voltage ($V_{oc}$), and fill factor (FF) as well as breakage, are typically monitored to maximize efficiency and minimize production cost.

Typically, substrates are tracked through the production process in "lots". This may be suboptimal, since tracking large lots does not always give sufficient visibility to understand the specific causes for poor quality and defects. Furthermore, once a cell is separated from its lot, its traceability has been lost.

There are many methods for marking and tracking substrates that are currently available (laser etching, etc), primarily though various semiconductor chip manufacturing processes. The application of these marking methods to the solar cell process however is problematic. Many of the marking and tracking processes add to the production cost by requiring additional operations, increasing the overall production time.

In addition, most solar cell designs do not have a convenient surface that can be marked. The front of the cell, as shown in FIG. 1, is optimized for light collection and the back of the cell is typically used for the backside contact.

A low cost method to identify and track individual solar cells through the production process would be beneficial. Ideally, the method would maintain traceability of the cell through the entire product lifespan.

SUMMARY

A method of identifying individual silicon substrates, and particularly solar cells, is disclosed. Every solar cell possesses a unique set of optical properties. The method identifies these properties and stores them in a database, where they can be associated to a particular solar cell. Unlike conventional tracking techniques, the present method requires no dedicated space on the surface of the silicon substrate. This method allows substrates to be tracked through the manufacturing process, as well as throughout the life of the substrate.

BRIEF DESCRIPTION OF THE DRAWINGS

For a better understanding of the present disclosure, reference is made to the accompanying drawings, which are incorporated herein by reference and in which.

DETAILED DESCRIPTION

Embodiments of this system are described herein in connection with solar cells. However, the embodiments of this system can be used with, for example, semiconductor substrates or flat panels. Thus, the invention is not limited to the specific embodiments described below.

Figure 3:
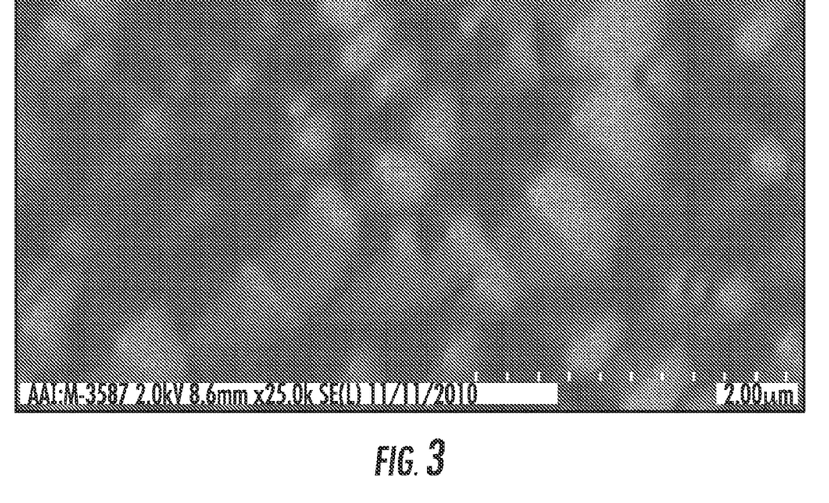
FIG. 3 is a SEM image of an etched silicon surface.

FIG. 3 is a SEM image of an etched silicon surface. Since silicon has a crystalline structure, the top surface of the substrate will also possess the same crystalline structure. This crystalline structure appears as a series of exposed "pyramids" on the surface of the silicon. This set of pyramids forms the contour of the surface of the silicon substrate, and is inherently unique. That is, no two etched substrates will possess the exact same pattern of pyramids on its surface.

Figure 4A:
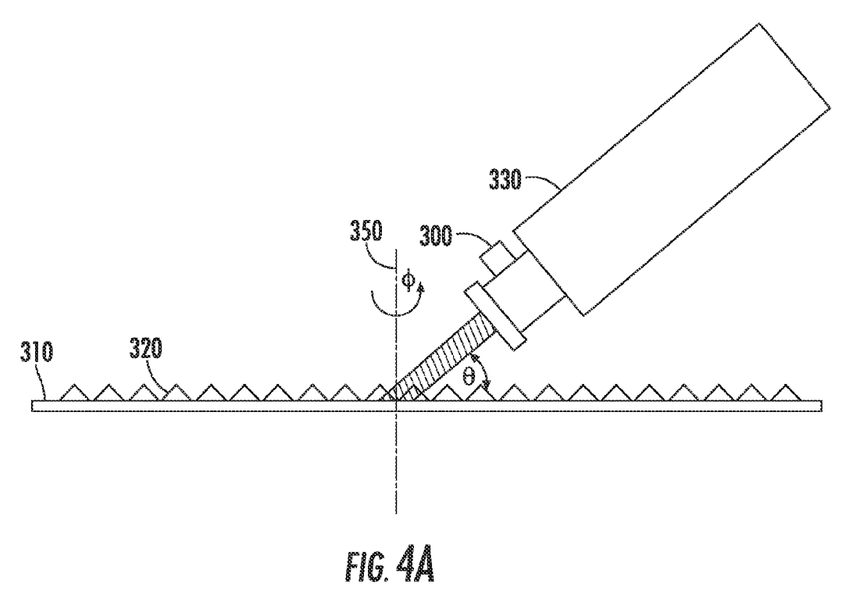
FIGS. 4A-C illustrate an apparatus for use with the present method according to several embodiments.

Thus, one can exploit this uniqueness to create an identification method within needed to dedicate space on the surface of the substrate to add markings or etchings. FIG. 4 shows a first embodiment of an apparatus used to read the contour of the surface of the substrate, and thereby create the unique identifier. A light source 300 is used to illuminate a portion of the substrate surface 310, which includes a plurality of discontinuities, or "pyramids" 320. The light is reflected toward a lens 330 which records the intensity of the light reflected back at the lens 330. In this embodiment, the light source 300 and lens 330 are shown as being coaxial, however, this is not a requirement of the present disclosure. The light source 300 and lens 330 can be arranged in any configuration which permits the reflected image from the surface 310 to be observed.

Figure 4B:
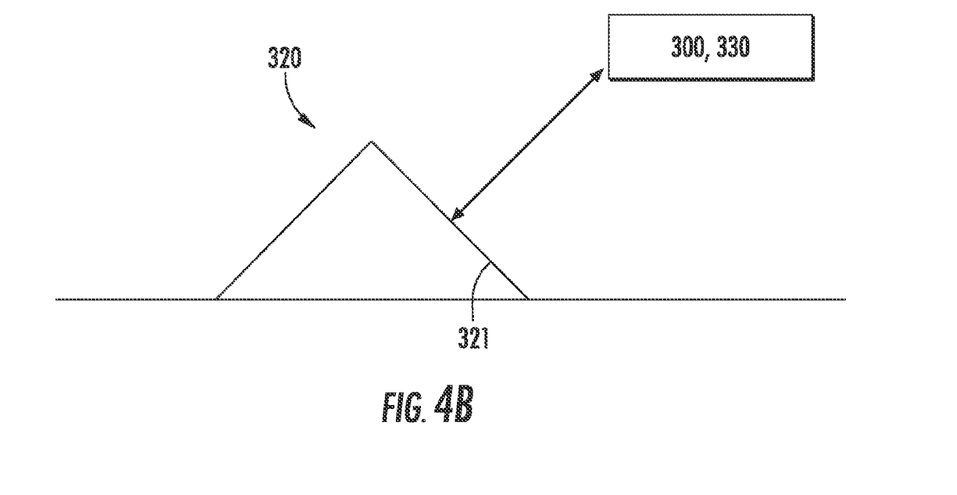

The angle of incidence, or tilt angle ($\theta$), between the incoming light beam and the surface 310 can be varied to insure the best reflectance. If the light source 300 and the lens 330 are coaxial, as shown in FIG. 4B, the best reflectance is obtained when the tilt angle is orthogonal (or normal) to the surfaces 321 of the "pyramids" 320. Since silicon crystallizes in a regular structure, the slope of the sides 321 of these "pyramids" 320 may be identical. In some embodiments, a tilt angle ($\theta$) of about 45° may be used, although other tilt angles are also within the scope of the disclosure.

Figure 4C:
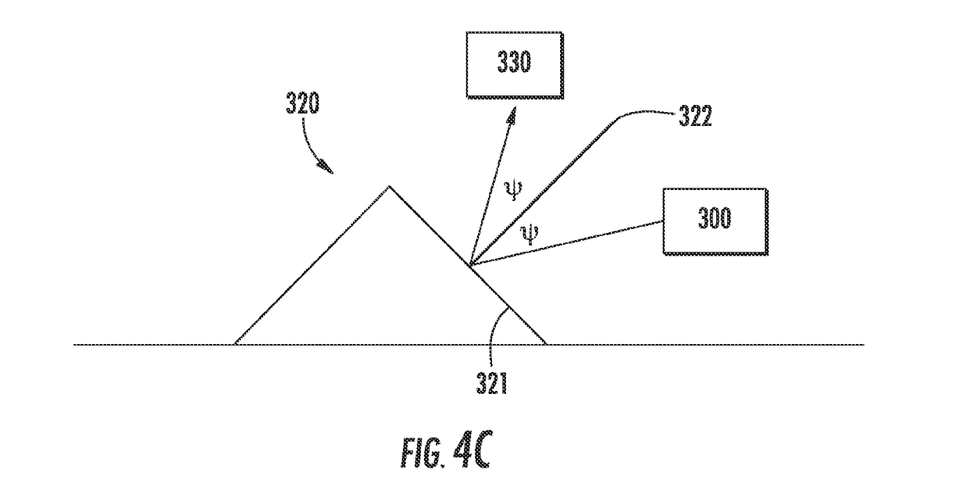

If the light source 300 and the lens 330 are not coaxial, as shown in FIG. 4C, other tilt angles may achieve the best reflectance. Light from the light source 300 strikes the sloped sides of the "pyramids" 320 at an angle of incidence ($\Psi$), which is defined as the difference between the tilt angle ($\theta$) and the normal vector 322 to the surface 321 of the pyramid. As is well known, the angle of reflectance (i.e. the angle at which the light reflects from the surface 321) is equal to the angle of incidence. Thus, if the difference between the angle at which the lens 330 is directed and the normal vector is equal to the angle of incidence, reflectance will be optimized. For example, assume the light source 300 is directed toward the sides of the pyramid at the tilt angle, and the resulting angle of incidence is determined to be $\Psi$, where the light source is below the normal vector. To optimize reflectance, the lens camera 330 should be positioned at an angle equal to the normal vector plus $\Psi$. In other words, the light source 300 and the lens 330 are positioned such that they are at equal angles relative to the normal vector of the sloped slide of the pyramid.

In addition, it may be advantageous to adjust the twist angle ($\Phi$) to optimize the reflected pattern. The twist angle ($\Phi$) is the angle about twist axis 350, which is perpendicular to the surface 310. As seen in FIG. 3, many of the "pyramids" 320 are aligned in the same direction. In the case of twist angle, reflectance is best when the twist angle aligns with the direction of the "pyramids" 320.

Figure 5:
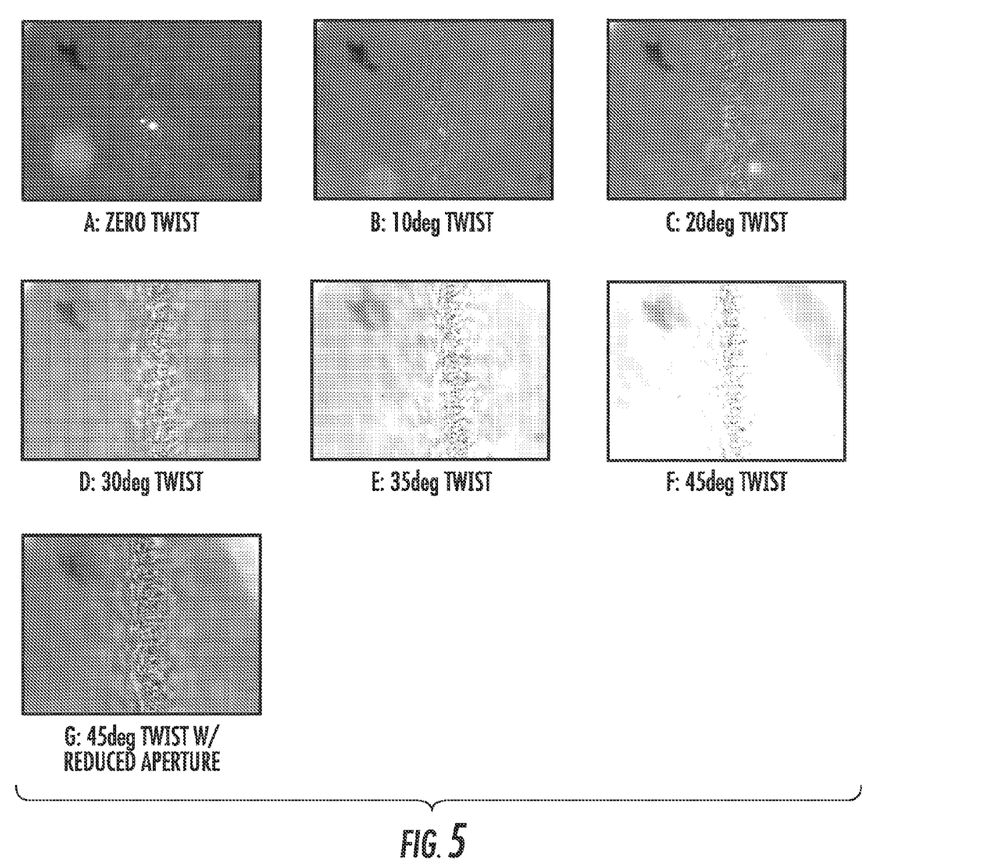
FIG. 5 illustrates the reflected light from a substrate at a range of twist angles.

By varying the tilt angle and the twist angle, the reflected image can be optimized. FIG. 5 shows the effects of varying twist angle from 0° from 45°. As the twist angle ($\Phi$) increases from 0° (FIG. 5A) to 45° (FIGS. 5F-G), a clearer pattern can be observed. This pattern is the set of reflections from individual linearly arranged contour aspects (i.e. a row of pyramids).

Figure 6:
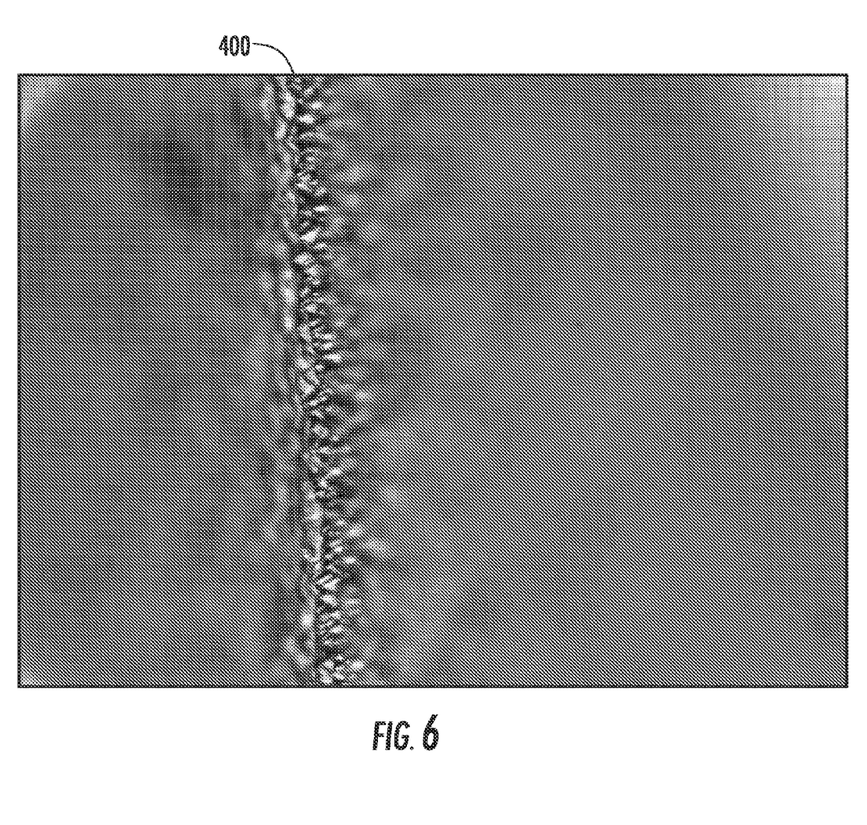
FIG. 6 shows a magnification of the reflected light from a substrate.

FIG. 6 shows a magnified view of FIG. 5G. The prominent strip 400 is the magnified reflection from the surface of the substrate, taken with a tilt angle of 45° and a twist angle of 45°.

Figure 7:
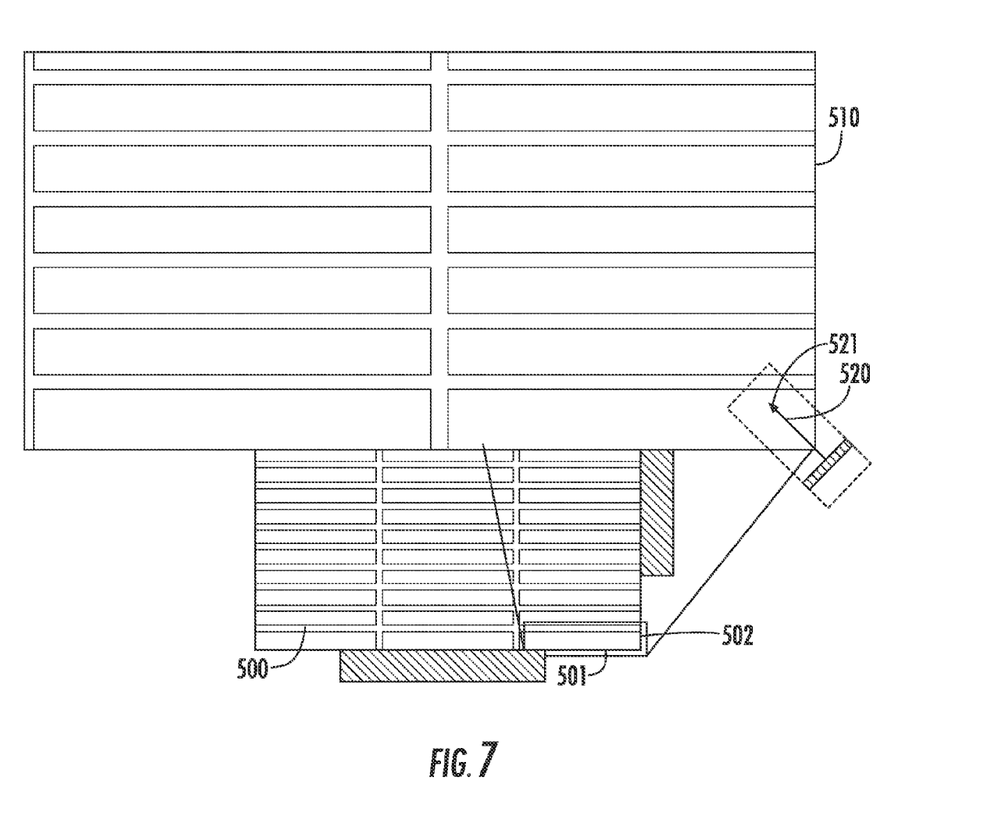
FIG. 7 shows one location which can be used according to one embodiment.

FIG. 7 shows a representative view of a solar cell 500. The lower right section of the solar cell 500 is enlarged and shown as region 510. A possible location 520 which may be used for the identification of the substrate is shown. This location may be referenced such as by using the edges 501, 502 of the substrate to define its location. In that way, the reflection pattern may be measured relative to these edges 501, 502. In operation, the light source 300 and lens 330 (see FIG. 4) may be moved from the corner of the substrate 500 toward the center of the substrate, as indicated by arrow 521. As the light source 300 and lens 330 moves forward, the reflected images are captured.

Figure 8:
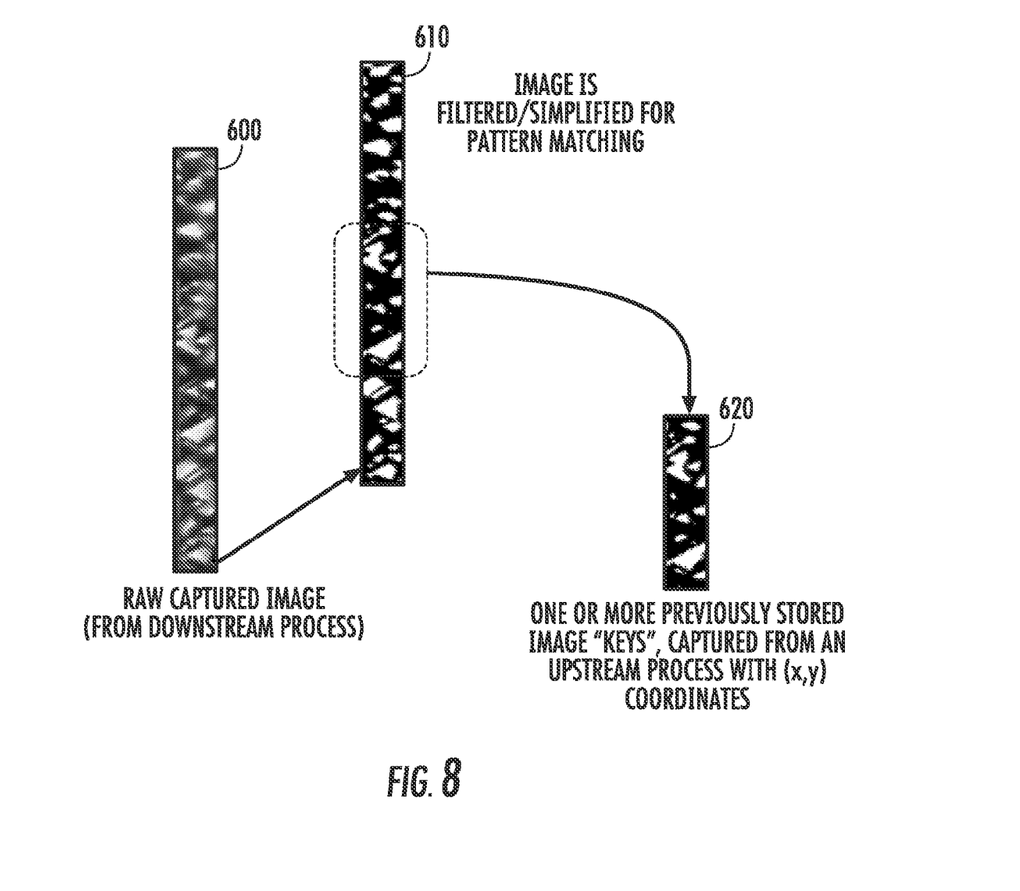
FIG. 8 shows different representations of the captured reflected image.

One representation of the raw captured image 600 is shown in FIG. 8. This image 600 may be stored in this format in memory as the identification key, if desired. In other embodiments, to save memory space and processing time, the raw captured image 600 is filtered to simplify subsequent pattern matching. Image 610 is one such filtered version of the raw image 600, although others are within the scope of the disclosure. The size of the stored image may vary. A longer image insures fewer erroneous matches, but requires more processing time. A smaller image, or a portion of the filtered image 610, such as region 620, may also be used as the identification key. This smaller image 620 is stored in memory. In all embodiments, the captured raw image 600, or some filtered or simplified representation of the captured raw image (such as the images 610, 620) is used as the identification key.

The detection and identification system includes the light source 300 and lens 330 (see FIG. 4), a memory element (which is nonvolatile in one instance) to store the captured image, a processing unit to execute a pattern matching algorithm. The processing unit is also in communication with a memory element which is used to store the computer readable instructions executed by the processing unit, as well as the data needed by the instructions. These instructions comprises one of more programs, which taken together are able to capture images, create representations of these captured images, store them in the memory element, and match these representations to those previously stored in the memory element. The instructions and memory element may also be used to create a database, which includes information about the identified substrate, which can be referenced at other times during the manufacturing process. In other embodiments, the database is a separate component, using a different processing unit and memory element. In some embodiments, the instructions may include means to modify an entry in the database with an update representation after a process step has been performed on the substrate. As is customary, the database is a set of structures, populated with data. Furthermore, relationships are defined which relate different data fields. The database is physically contained within a memory element, which, in one case, can be rewritten and is non-volatile.

In one embodiment, the processing unit captures an image. It then creates a representation of this image. It then searches the previously stored representations for one that matches the representation of the recently captured image. In some embodiments, the pattern matching algorithm is able to tolerate some number of discrepancies or offset. For example, during the processing of the substrate, it is possible that one or more of the exposed "pyramids" may be damaged or altered, thereby changing the reflectance pattern. For example, the deposition of an anti-reflection coating (ARC) may affect one or more of the contours. If exact pattern matching is required, a processed substrate may not be properly associated with its previously captured image, which was made before the processing step that caused the damage.

Figure 9A:
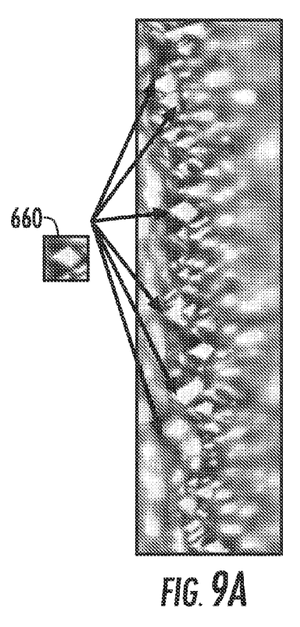
FIGS. 9A-C show another embodiment used to represent the captured reflected image.
Figure 9B:
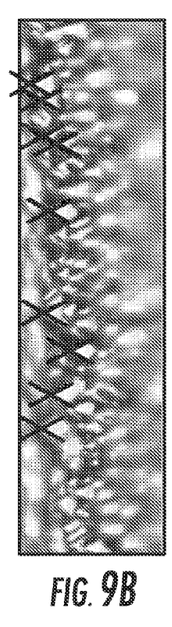
Figure 9C:
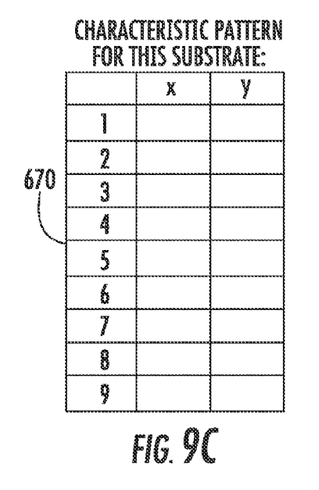

In another embodiment, the captured image is stored in the memory element as a set of coordinate locations, where these coordinates correspond to particular features in the image. FIG. 9 shows an example of the raw image data 600 of FIG. 8. Within the captured raw image 600, there are a number of unique particular features, such as diamonds and triangles. In one embodiment, these features 660 are identified, as shown in FIG. 9A. Each is then tagged with its coordinate location, based on a fixed reference point, as shown in FIG. 9B. The resulting set of coordinate locations can then be stored in a table 670, which represents the characteristic pattern for this substrate, as shown in FIG. 9C. Thus, rather than storing a pictorial representation of the reflected image, a representation which includes a set of coordinate data which describes the image is stored in the memory element instead.

For purposes of this disclosure, the term "representation" is used to denote any means for encoding and saving the captured raw image. Representations may include the raw image, a filtered version of the raw image; a subset of the raw image; a subset of the filtered version; a set of coordinate locations representing particular features in the surface. Other means of representing the raw image are also within the scope of the disclosure.

Figure 10:
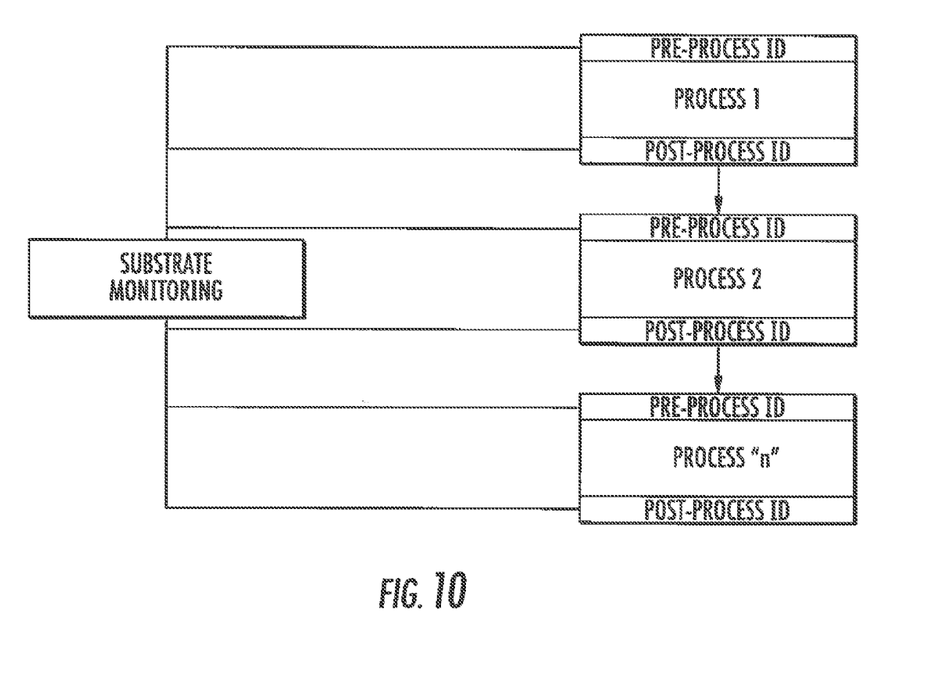
FIG. 10 illustrates a flow chart using substrate monitoring.

In another embodiment, the system may monitor and track the changes in the reflectance pattern caused by substrate processing. For example, FIG. 10 shows a flowchart which utilizes the identification system. Before the first process (Process 1) begins, a reflected image is captured and a representation of this image is created. This representation is then compared to all existing images. If a match is found, then the system determines that this substrate has been previously entered into the database and accesses its entry in the database. In this way, the system may recall data and information associated with the substrate. If no match is found, the system may create a new entry in the database for this particular substrate.

After the substrate has been identified, it undergoes Process 1. In some embodiments, a second identification process is performed following the completion of Process 1. For example, knowing that the surface of the substrate may become slightly altered as a result of certain processes, the system may capture a new reflected image from the substrate after Process 1 is completed. In some embodiments, the system uses this updated reflected image, or a representation thereof, to replace the existing image being used for identification, as this is now the more accurate representation of the substrate surface. Thus, the identification key for the solar cell can be updated based on its altered characteristics. In other embodiments, the original captured image is maintained and the pattern-matching algorithm is designed to compensate for changed in reflectance based on processing. In some embodiments, the database contains information about the substrate, such as the process steps that it underwent, the process parameters used for those steps, and other unique parameters.

As the substrate is moved to Process 2, a new reflected image of the surface of the substrate is acquired. As described above, this recently acquired image is compared to that stored in the database. As noted above, the image or representation thereof stored in the database may be the image acquired originally, or may be an image that was updated based on changed in reflectance due to a previous process step. In the case of an updated stored image, it may be more likely that the new reflected image is identical to the stored image, as the substrate has not undergone any processing between the two identification cycles.

Once the substrate has been identified, Process 2 can be performed. As described above, after the process is completed, a new image may be obtained and saved. In addition, information concerning the parameters of Process 2 may be stored in the database associated with the substrate.

This process can be repeated for any number of process steps, as shown in FIG. 10.

In some embodiments, the database is configured to store various types of information about the substrate. This information may include, but is not limited to:

The lot which this substrate is part of;
Captured image, or representation thereof;
Updated captured images or representations thereof;
Processes performed on substrate;
Date/Time of each process;
Process parameters; and
Measured operating parameters.

Such information can be used for a number of purposes. For example, the information can be used for quality control purposes. In other embodiments, it may be used for process control, process assurance, troubleshooting or other purposes.

In another embodiment, the identification key may be used as a fiducial for subsequent process steps. For example, as described above, the general location of the identification key may be referenced to the edges 501, 502 of the substrate. The light source 300 and lens 330 then proceed from the corner of the substrate 500 toward the center of the substrate, using the edges 501, 502 to determine the approximate location of the identification. As the lens 330 captures the reflected image, it is compared to those stored in a database. When a match is found, the system determines the relative location of the identification key (see FIG. 8). In other words, the reflected image 600, which is preferably a stripe as shown in FIG. 8, may include the identification key embedded in it. The portion of the reflected image 600 captured before the identification key, and the portion captured thereafter, are typically discarded. However, the system can use the relative location of start, or end of the identification key within the captured image 600 as an exact reference point. The position within the captured image 600 can be translated into a physical location, based on the speed, resolution and positions of the light source 300 and the lens 330. This reference point can be used as a fiducial for subsequent process steps.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method of uniquely identifying a solar cell from a plurality of solar cells, comprising:
   illuminating a portion of a surface of said solar cell with a light source, said light source aimed at said surface at a tilt angle and a twist angle;
   capturing a first reflected image with a lens;
   creating a representation of said first reflected image using a processing unit;
   comparing a portion of said representation to identification keys previously stored in a database contained in a memory, wherein said identification keys are associated with previously identified solar cells, and each identification key is based on a unique pattern of pyramids disposed on its associated solar cell; and
   identifying said solar cell with a unique identifier based on said comparing;
   wherein a physical location of said identification key on said solar cell is determined based on its position in said first reflected image.

2. The method of claim 1, further comprising:
   creating a new entry in said database for said solar cell if said identification key does not match any of said identification keys previously stored in said database, and storing said identification key in said new entry.

3. The method of claim 1, wherein said light source and said lens are coaxial and wherein said pyramids have sloped sides, whereby said tilt angle is orthogonal to said sloped sides.

4. The method of claim 1, wherein said light source and said lens are not coaxial and wherein said pyramids have sloped sides, wherein each of said sloped sides has a normal vector, and wherein said light source and said lens are positioned such that said light source and said lens are at equal angles relative to said normal vector of one of said sloped slides of said pyramid.

5. The method of claim 1, wherein said twist angle is selected to optimize reflectance from said pyramids.

6. The method of claim 1, further comprising performing a process step on said solar cell after said identification step.

7. The method of claim 6, further comprising performing the steps of:
   illuminating said portion of said surface of said solar cell with said light source, said light source aimed at said surface at said tilt angle and said twist angle;
   capturing a second reflected image with a lens;
     creating a second representation of said second reflected image, which represents a second identification key;
     replacing said identification key associated with said solar cell with said second identification key.

8. The method of claim 1, wherein said database comprises information about processes undergone by said solar cell.

9. The method of claim 1, wherein said database comprises operating parameters of said solar cell.

10. The method of claim 1, wherein said representation comprises a filtered version of said first reflected image.

11. The method of claim 1, wherein said representation comprises a set of coordinate locations corresponding to features found in said first reflected image.

12. The method of claim 1, wherein said portion is referenced to edges of said solar cell.

13. A system for uniquely identifying and tracking a solar cell from a plurality of solar cells, comprising:
   a light source to illuminate a surface of said solar cell;
   a lens to capture a reflected image from said surface;
   a first memory element comprising a database comprising entries comprising representations of previously captured images from previously identified solar cells;
   a processing unit, in communication with a second memory element; and
   said second memory element comprising computer executable instructions adapted to create a representation of said reflected image based on a unique pattern of pyramids disposed on said surface, match said created representation of said reflected image against said entries comprising said representations of said previously captured images in said database, and provide a unique identifier for said solar cell;
   wherein said created representation comprises a portion of said reflected image, and said computer executable instructions are further adapted to determine a physical location of said created representation based on its position within said reflected image.

14. The system of claim 13, wherein said computer executable instructions further comprise means to add new entries into said database if said representation of said reflected image is not matched to any of said entries in said database.

15. The system of claim 13, wherein said computer executable instructions further comprises means to modify an entry with an updated representation of a second reflected image after a process step has been performed.

16. A method of uniquely identifying a solar cell from a plurality of solar cells, comprising:
   illuminating a portion of a surface of said solar cell with a light source, said light source aimed at said surface at a tilt angle and a twist angle;
   capturing a first reflected image with a lens;
   creating a representation of said first reflected image, which represents an identification key based on a unique pattern of pyramids disposed on said portion of a said surface, using a processing unit;
   comparing said representation to other identification keys previously stored in a database contained in a memory, wherein said other identification keys are associated with previously identified solar cells; and
identifying said solar cell with a unique identifier based on said comparing,
   wherein said light source and said lens are not coaxial and wherein said pyramids have sloped sides, wherein each of said sloped sides has a normal vector, and wherein said light source and said lens are positioned such that said light source and said lens are at equal angles relative to said normal vector of one of said sloped slides of said pyramid.

17. The method of claim 16, further comprising:
   creating a new entry in said database for said solar cell if said identification key does not match any of said other identification keys previously stored in said database, and
   storing said identification key in said new entry.

18. The method of claim 16, wherein said twist angle is selected to optimize reflectance from said pyramids.

19. The method of claim 16, wherein said database comprises information about processes undergone by said solar cell.

20. The method of claim 1, wherein said database comprises operating parameters of said solar cell.

* * * * *